(12) United States Patent
Chen et al.

(10) Patent No.: US 7,339,272 B2
(45) Date of Patent: Mar. 4, 2008

(54) SEMICONDUCTOR DEVICE WITH SCATTERING BARS ADJACENT CONDUCTIVE LINES

(75) Inventors: Kuei Shun Chen, Hsin-Chu (TW); Chin-Hsiang Lin, Hsin-Chu (TW); Yung-Sung Yen, Taipei County (TW); Chih-Ming Lai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 534 days.

(21) Appl. No.: 10/867,076

(22) Filed: Jun. 14, 2004

(65) Prior Publication Data

US 2005/0277067 A1    Dec. 15, 2005

(51) Int. Cl.
*H01L 23/48* (2006.01)
*H01L 23/52* (2006.01)
*H01L 29/50* (2006.01)

(52) U.S. Cl. ............... 257/758; 257/774; 257/E23.145
(58) Field of Classification Search ............... 257/758, 257/774, E23.145
See application file for complete search history.

(56) References Cited

U.S. PATENT DOCUMENTS

| | | | |
|---|---|---|---|
| 5,476,817 A | 12/1995 | Numata | |
| 5,751,056 A | 5/1998 | Numata | |
| 5,798,298 A | 8/1998 | Yang et al. | |
| 5,811,352 A | 9/1998 | Numata et al. | |
| 6,258,715 B1 | 7/2001 | Yu et al. | |
| 6,259,115 B1 | 7/2001 | You et al. | |
| 6,307,265 B1 | 10/2001 | Anand et al. | |
| 6,492,097 B1 | 12/2002 | Chen et al. | |
| 6,492,259 B2 | 12/2002 | Dirahoui et al. | |
| 6,610,592 B1 | 8/2003 | Shue et al. | |
| 6,664,642 B2 * | 12/2003 | Koubuchi et al. | 257/776 |
| 6,833,622 B1 * | 12/2004 | Zagrebelny et al. | 257/752 |
| 2001/0022399 A1 | 9/2001 | Koubuchi et al. | |
| 2002/0003305 A1 | 1/2002 | Umakoshi et al. | |
| 2002/0048929 A1 | 4/2002 | Nalk et al. | |
| 2002/0175419 A1 * | 11/2002 | Wang et al. | 257/774 |
| 2003/0042611 A1 | 3/2003 | Mori | |
| 2003/0092260 A1 | 5/2003 | Lui et al. | |
| 2003/0205817 A1 | 11/2003 | Romankiw | |
| 2003/0237064 A1 * | 12/2003 | White et al. | 716/5 |
| 2004/0113238 A1 | 6/2004 | Hasunuma et al. | |
| 2004/0119164 A1 | 6/2004 | Kurashima et al. | |
| 2005/0110151 A1 | 5/2005 | Tamura et al. | |
| 2005/0121790 A1 * | 6/2005 | Cleeves et al. | 257/758 |
| 2005/0253268 A1 | 11/2005 | Hsu et al. | |
| 2006/0118960 A1 * | 6/2006 | Landis | 257/758 |

OTHER PUBLICATIONS

Wolf, S., et al., "Silicon Processing for the VLSI Era: vol. 1—Process Technology," 2nd Ed., pp. 628-630, Laltice Press, Sunset Beach, CA, 2000.

* cited by examiner

Primary Examiner—Nitin Parekh
(74) Attorney, Agent, or Firm—Slater & Matsil, L.L.P.

(57) ABSTRACT

A semiconductor device and method of manufacture thereof wherein scattering bars are disposed on both sides of an isolated conductive line of a semiconductor device to improve the lithography results. The scattering bars have a sufficient width and are spaced a sufficient distance from the isolated conductive line so as to increase the depth of focus of the isolated conductive line during the patterning of the semiconductor device. The scattering bars are left remaining in the finished semiconductor device after the manufacturing process is completed.

11 Claims, 11 Drawing Sheets

SEMICONDUCTOR DEVICE WITH SCATTERING BARS ADJACENT CONDUCTIVE LINES

TECHNICAL FIELD

The present invention relates generally to the manufacturing of semiconductor devices, and more particularly to damascene methods of forming conductive features of semiconductor devices.

BACKGROUND

Semiconductor devices are manufactured by forming active regions in a semiconductor wafer or workpiece, depositing various insulating, conductive, and semiconductive layers over the workpiece, and patterning them in sequential steps. The upper or last-formed layers of a semiconductor device typically comprise metallization layers that provide connections to underlying active regions and connections within and over the workpiece. The metallization layers typically comprise one or more layers of metal interconnect having conductive lines disposed within an insulating material.

One method of forming metallization layers is referred to in the art as a damascene process. Damascene processes are often used to form copper conductive lines because copper is difficult to subtractively etch, for example. In a damascene process for forming conductive lines, first, an insulating material or dielectric material is deposited over a semiconductor workpiece, and the insulating material is patterned using photolithography with trenches, holes, and/or channels. The trenches, holes, and/or channels are filled with a conductive material to form vias, contacts, plugs, and conductive lines within the insulating material. A chemical-mechanical polish (CMP) process or an etch process is typically then used to remove excess conductive material from over the top surface of the insulating material.

A damascene process may be single damascene or dual damascene. In a single damascene process, a single pattern is formed within a single layer of insulating material. The single layer may comprise a conductive line layer or a via/contact layer, for example. Multiple layers of interconnects may be formed by alternating conductive line layers and via/contact layers, each formed in a separate insulating material layer, for example.

In a dual damascene process, two patterns may be formed within a single layer of insulating material. For example, one pattern may be a conductive line layer and the other pattern may be a via/contact layer. A dual damascene process may comprise a via first or via last damascene process. A via last process is also referred to in the art as a 'trench first' process because trenches for conductive lines are formed first. In a via first dual damascene method, via patterns are formed within an entire thickness of the insulating material, followed by the formation of trenches for conductive lines within a top portion of the insulating material, over the via patterns. In a trench first dual damascene process, the trenches for conductive lines are first formed within a top portion of the insulating material, followed by the formation of the via pattern within the entire thickness of the insulating material beneath the patterns for the conductive lines.

The trend in the semiconductor industry is towards the miniaturization or scaling down in the size of semiconductor device features. Conductive lines in the metallization layers are being reduced as small as possible to increase device speed and accommodate the need for a reduction in size of semiconductor devices.

A problem in scaling down the size of semiconductor devices is that the photolithography techniques used to pattern the various material layers become challenging as device features shrink. Optical photolithography involves projecting or transmitting light through a pattern made of optically opaque areas and optically clear areas on a mask or reticle. As a light beam projects onto a wafer during patterning, interference of the light may be produced which can distort the shape of the desired pattern and deleteriously affect the critical dimension (CD) of the semiconductor device.

Optical proximity correction (OPC) is typically used to improve photolithography processes of semiconductor devices. One type of OPC involves using serifs on a photolithography mask to decrease diffraction effects. Another type of OPC is referred to in the art as scattering bars which are used for correcting and reducing the proximity effect in photolithography. The scattering bars comprise bar-like patterns that are formed on the photolithography mask. During exposure of a photoresist deposited on a semiconductor wafer, the scattering bars formed along the periphery of the pattern on the mask pass light and scatter the light to decrease the proximity effect on the design of the pattern desired.

Some semiconductor device designs have closely-spaced patterns on one part of a semiconductor die and widely-spaced patterns on another part of the same semiconductor die. For example, lines within a memory-array region of a chip are typically regularly and closely spaced, but in the peripheral sense-amplifier and logic circuitry, the lines are typically spaced farther apart and are more isolated. Proximity effects are particularly problematic in regions of a semiconductor device having isolated features in such a semiconductor device. In more densely populated regions of the semiconductor device, the photolithography exposure conditions are typically not as problematic.

If conductive lines in closely-spaced patterns have different dimensions than conductive lines in widely-spaced patterns due to proximity effects, the resistivity Rs of the conductive lines varies from widely-spaced patterns and closely-spaced patterns, which is undesirable because the electrical performance of the integrated circuit is deleteriously impacted.

Thus, what is needed in the art is a method of improving lithography techniques for integrated circuits having both widely-spaced and closely-spaced patterns.

SUMMARY OF THE INVENTION

Preferred embodiments of the present invention achieve technical advantages by forming scattering bars within a conductive material layer of a semiconductor device. The scattering bar patterns are formed when the patterns for conductive lines are formed in a damascene process, and the scattering bars remain in the finished semiconductor device product. The scattering bars increase the depth of focus of the adjacent conductive lines and improve the resolution of the conductive lines formed.

In accordance with a preferred embodiment of the present invention, a method of manufacturing a semiconductor device includes providing a workpiece, forming a first insulating material over the workpiece, and patterning the first insulating material with a first conductive line pattern and at least one scattering bar pattern. The first conductive line pattern has a first side and a second side opposing the first side. The at least one scattering bar pattern is adjacent at least the first side or the second side of the first conductive line pattern, and is spaced apart from the first conductive line pattern a sufficient distance to increase the depth of focus of the first conductive line pattern. A conductive material is over the first insulating material, filling the first conductive line pattern and the at least one scattering bar pattern with the conductive material, forming a first conductive line and at least one scattering bar adjacent at least the first side or the second side of the first conductive line pattern. The at least one scattering bar is left remaining in the semiconductor device after the manufacturing process is completed.

In accordance with another preferred embodiment of the present invention, a method of manufacturing a semiconductor device includes providing a workpiece, forming a first insulating material over the workpiece, and patterning the first insulating material with at least one first conductive line pattern, a first scattering bar pattern, and a second scattering bar pattern. The at least one first conductive line pattern has a first side and a second side opposite the first side. The first scattering bar pattern is adjacent the at least one first conductive line pattern first side, and the second scattering bar pattern is adjacent the at least one first conductive line pattern second side. The first scattering bar pattern and the second scattering bar pattern are spaced apart from the at least one first conductive line pattern by a distance sufficient to increase the depth of focus of the at least one first conductive line pattern. A conductive material is deposited over the first insulating material, filling the at least one first conductive line pattern, the first scattering bar pattern and the second scattering bar pattern to simultaneously form at least one first conductive line, a first scattering bar and a second scattering bar. The at least one first conductive line has a first side and a second side opposite the first side. The first scattering bar is adjacent the at least one first conductive line first side, and the second scattering bar is adjacent the at least one first conductive line second side. The first scattering bar and the second scattering bar are left remaining in the semiconductor device after the manufacturing of the semiconductor device is completed.

In accordance with yet another preferred embodiment of the present invention, a method of manufacturing a semiconductor device includes providing a workpiece, forming a photosensitive insulating material over the workpiece, and directly patterning the photosensitive insulating material with a first conductive line pattern and at least one scattering bar pattern. The first conductive line pattern has a first side and a second side. The at least one scattering bar pattern is adjacent the first side, the second side, or both the first side and the second side, of the first conductive line pattern. The at least one scattering bar pattern is spaced apart from the first conductive line pattern by a sufficient distance to increase the depth of focus of the first conductive line pattern. A conductive material is deposited over the photosensitive insulating material, filling the first conductive line pattern and the at least one scattering bar pattern with the conductive material, forming a first conductive line and at least one scattering bar adjacent at least the first side, the second side, or both the first side and the second side, of the first conductive line.

In accordance with another preferred embodiment of the present invention, a semiconductor device includes a workpiece, an insulating material disposed over the workpiece, and a first conductive line disposed within the insulating material, the first conductive line comprising a first side and a second side and having a first length. An N number of first scattering bars are disposed within the insulating material adjacent and spaced apart from the first side of the first conductive line, the first scattering bars comprising a second length, wherein the second length is about equal to the first length. The first conductive line is electrically active, and the N number of first scattering bars are electrically inactive.

Advantages of preferred embodiments of the present invention include providing a semiconductor device having scattering bars formed on either side of conductive lines within metallization layers of the device. The scattering bars improve the depth of focus of the pattern of the conductive lines and improve the resolution of the lithography process. Advantageously, because the scattering bars are not electrically connected to active regions of the semiconductor device, they may be left remaining in the structure in the finished semiconductor device, thereby not requiring additional manufacturing steps to remove them. A semiconductor device with conductive lines of equal dimensions in both dense regions and isolated regions may be manufactured using embodiments of the present invention, resulting in a semiconductor device with improved performance and consistent values of Rs in various regions of the die.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device having both dense regions and isolated regions. Embodiments of the invention may also be applied, however, to other semiconductor devices comprising one or more metallization layers. Embodiments of the present invention also have application in lithography processes for patterning insulating, conductive, and/or semiconductive material layers of a semiconductor device.

Figure 1:
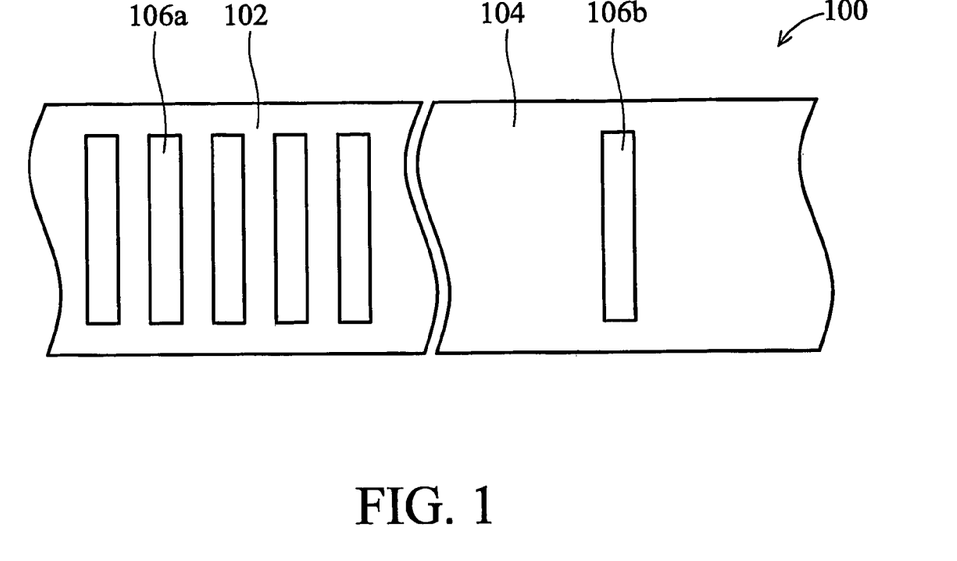
FIGS. 1 and 2 show a semiconductor device having a dense region and an isolated region, wherein scattering bars are added along the length of a conductive line in the isolated region on both sides of the conductive line, in accordance with an embodiment of the present invention.
Figure 2:
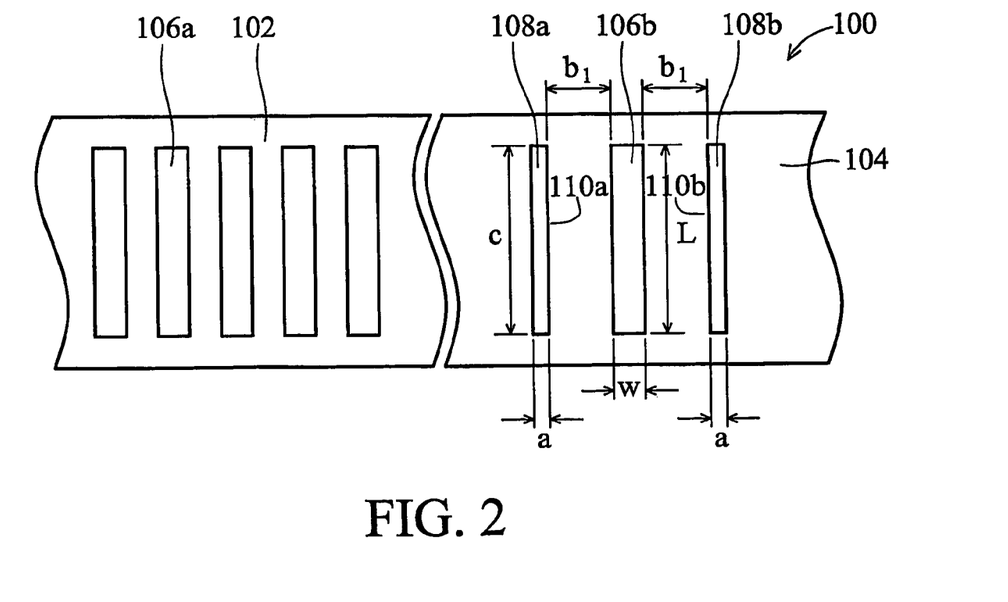
Figure 3:
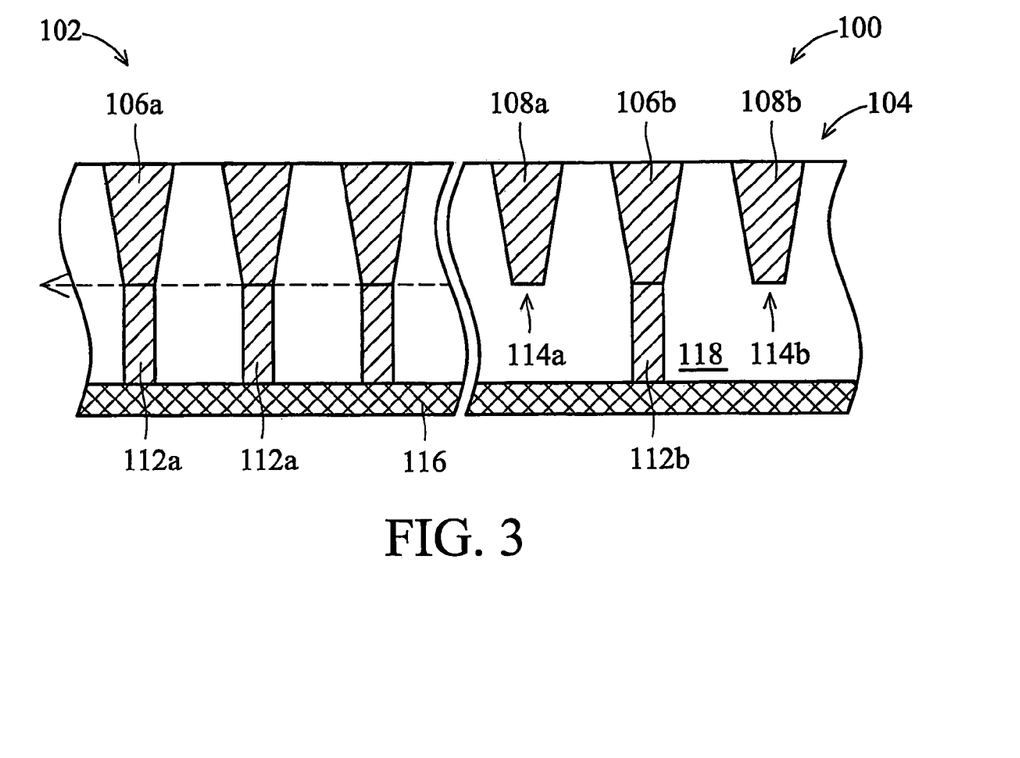
FIG. 3 shows a cross-sectional view of the semiconductor device shown in FIG. 2.

FIGS. 1 and 2 show a semiconductor device having a dense region and an isolated region, wherein scattering bars are added along the length of a conductive line in the isolated region on either side of the conductive line, in accordance with an embodiment of the present invention. FIG. 3 shows a cross-sectional view of the semiconductor device shown in FIG. 2. Referring first to FIG. 1, a semiconductor device 100 having a dense region 102 comprising a plurality of closely spaced conductive lines 106a and an isolated region 104 comprising at least one isolated conductive line 106b is shown. While only one conductive line 106b is shown in FIG. 1, there may be a plurality of conductive lines 106b in the isolated region. The conductive lines 106b in the isolated region 104 are not as closely spaced as are the conductive line 106a in the dense region 102 of the semiconductor device 100.

In accordance with embodiments of the present invention, after the semiconductor device 100 design layout has been designed, as is shown in FIG. 1, scattering bars 108a and 108b are added to the semiconductor device 100 pattern layout in the isolated region 104, as shown in FIG. 2. The scattering bars 108a and 108b preferably extend substantially along the entire length L of the isolated conductive lines 106b, as shown at length "c" of the scattering bars 108a and 108b. The length L of the conductive line 106b may be several μm or other dimensions, for example. The isolated conductive lines 106b comprise a width "w" which in one embodiment preferably comprises about 130 nm or less, although alternatively, the conductive lines 106b may comprise other dimensions.

The scattering bars 108a and 108b preferably comprise a width "a" that is preferably ½w or greater. For example, the scattering bars 108a and 108b are preferably at least half the width of the isolated conductive lines 106b. In one embodiment, the scattering bars 108a and 108b comprise about ½w, as an example. The scattering bars 108a and 108b are preferably spaced apart from the isolated conductive lines 106b by a distance "$b_1$", wherein $b_1$ is equal to between about ½w to about 1 μm.

In accordance with one embodiment of the present invention, at least one scattering bar 108a is placed adjacent a first side 110a of the conductive line 106b, and at least one scattering bar 108b is disposed proximate the second side 110b of the conductive line 106b, as shown. A plurality of scattering bars 108a and 108b may be disposed on opposing sides 110a and 110b, respectively, of the isolated conductive line 106b. If more than one feature such as an isolated conductive line 106b is disposed in the isolated region 104 of the semiconductor device 100, preferably, scattering bars 108a and 108b are disposed on both sides of the additional conductive lines 106b (not shown).

The scattering bars 108a and 108b are advantageous in that they provide OPC for the isolated conductive line 106b lithography process. The scattering bar 108a and 108b patterns increase the depth of focus of the pattern for the conductive line 106b during the photolithography process, resulting in improved CD of the semiconductor device, and consistent Rs values for conductive lines 106a and 106b in the dense regions 102 and isolated regions 104 of the semiconductor device 100. The scattering bars 108a and 108b preferably remain within the semiconductor device 100 after the manufacturing of the semiconductor device is completed.

FIG. 3 shows a cross-sectional view of the semiconductor device 100 shown in FIG. 2. In accordance with embodiments of the present invention, vias 112a and 112b are formed in the dense region 102 and isolated region 104 of the semiconductor device 100, respectively, as shown. A plurality of conductive lines 106a are formed over and abutting the vias 112a in the dense region 102. The isolated region 104 includes the isolated conductive line 106b formed over and abutting the via 112b, with a scattering bar 108a and 108b formed adjacent yet spaced away from the isolated conductive line 106b on each side of the isolated conductive line 106b, as shown.

The vias 112a and 112b and the conductive lines 106a, 106b, and scattering bars 108a and 108b may be formed using two sequential single damascene processes or using one dual damascene process, to be described further herein. The vias 112a and 112b, conductive lines 106a, 106b, and scattering bars 108a and 108b are formed in an insulating material 118, as shown, although the insulating material 118 may alternatively comprise two insulating material layers, if two single damascene processes are used, also to be described herein.

Preferably, in accordance with embodiments of the present invention, a region 114a and 114b is disposed beneath each scattering bar 108a and 108b, wherein the regions 114a and 114b do not include vias. Thus, the scattering bars 108a and 108b are preferably not electrically connected to any other part of the semiconductor device 100, as shown, and are electrically inactive. The conductive line 106b are preferably electrically active and are connected to other connective lines or active components of the semiconductor device 100. The semiconductor device 100 may optionally include one or more conductive lines 116 disposed beneath and optionally, connected to one or more of the vias 112a and 112b.

FIGS. 4 through 8 show cross-sectional views of a preferred embodiment of the present invention implementing single damascene manufacturing processes. Only the isolated region 104 of the semiconductor device 100 is shown in FIGS. 4 through 8; however, similar processing steps are simultaneously performed in the dense regions 102 of the workpiece, not shown, with the exception that preferably, scattering bars are not formed in the dense regions 102 of the workpiece.

Figure 4:
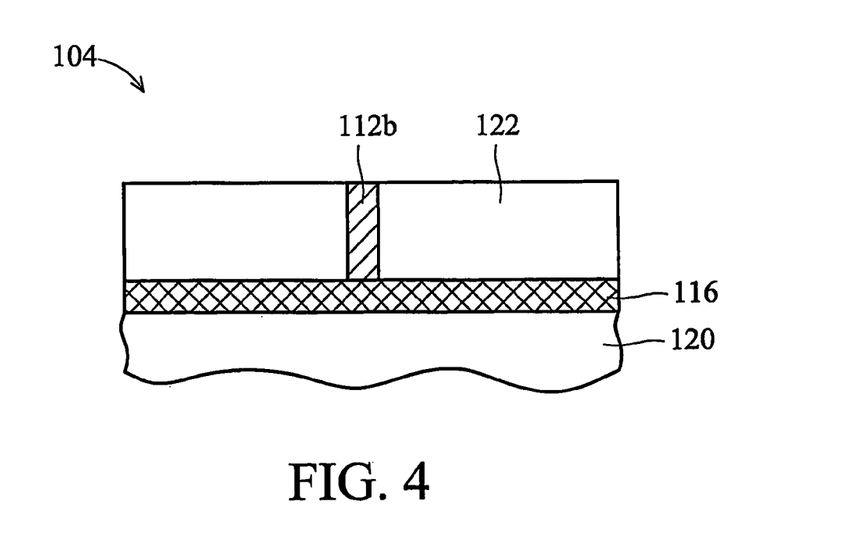
FIGS. 4 through 8 show cross-sectional views of a preferred embodiment of the present invention implemented in a single damascene manufacturing process.

Referring next to FIG. 4, first, a workpiece 120 is provided. The workpiece 120 may include a semiconductor substrate comprising silicon or other semiconductor materials covered by an insulating layer, for example. The workpiece 120 may also include other active components or circuits formed in the front end of line (FEOL), not shown. The workpiece 120 may comprise silicon oxide over single-crystal silicon, for example. The workpiece 120 may include other conductive layers or other semiconductor elements, e.g. transistors, diodes, etc. Compound semiconductors, GaAs, InP, Si/Ge, or SiC, as examples, may be used in place of silicon.

An optional first metallization layer comprising one or more conductive lines 116 may be formed over the workpiece 120, as shown in FIG. 4.

A first single damascene process is used to form a via layer of interconnect. In this first single damascene process, a first insulating material 122 is formed over the conductive lines 116, or over the workpiece 120 if no conductive lines 116 are present. The first insulating material 122 is patterned with a pattern for vias 112b, for example, by depositing a photoresist (not shown) over the first insulating material 122, patterning the photoresist using a lithography mask (also not shown), and using the photoresist to pattern the first insulating material 122. Alternatively, the first insulating material 122 may be patterned using electron beam lithography (EBL) or other direct patterning method, for example.

A conductive material is deposited over the first insulating material 122, and the excess conductive material is removed from the top surface of the first insulating material 122 using CMP or an etch process to form a via 112b in the isolated region 104 of the workpiece 120.

Figure 5:
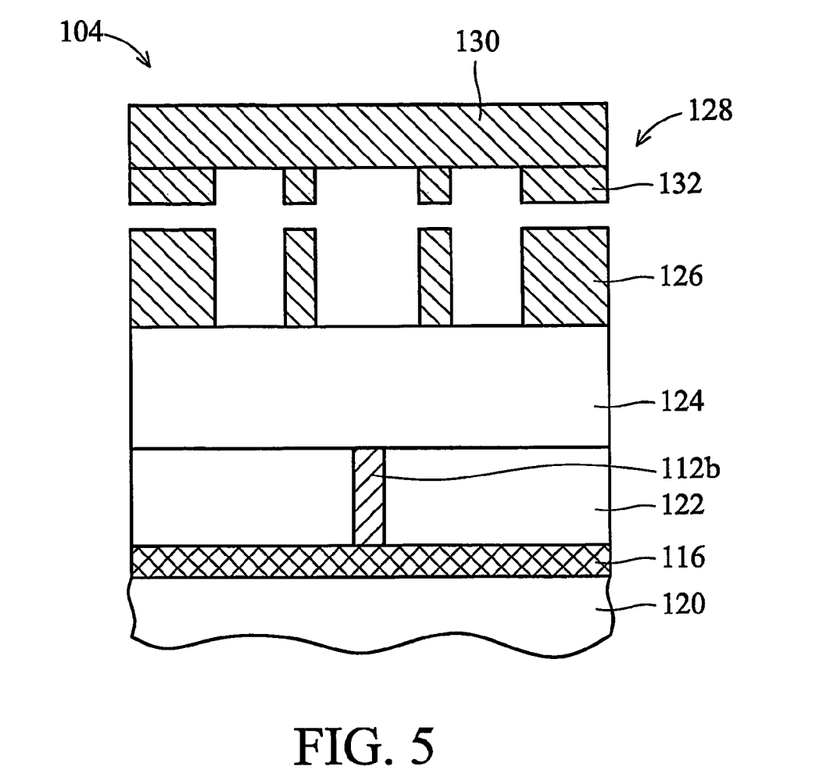
Figure 6:
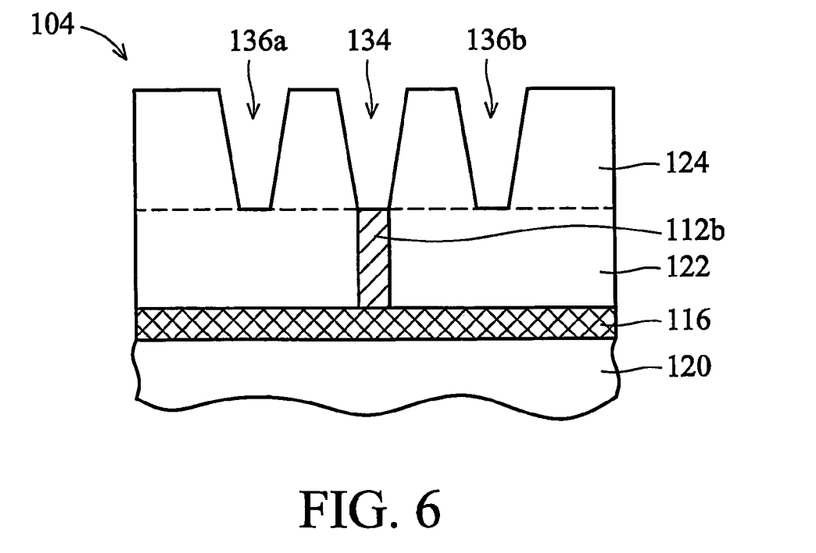

Next, a second single damascene process is used to form an interconnect layer or metallization layer containing conductive lines. In this second single damascene process, a second insulating material 124 is deposited or formed over the first insulating material 122 and via 112b, as shown in FIG. 5. The second insulating material 124 is then patterned, for example, by depositing a photoresist 126 over the second insulating material 124, and patterning the photoresist 126 using a lithography mask 128 having a pattern for conductive lines and scattering bars formed therein. For example, the mask 128 preferably comprises a transparent area 130 and opaque areas 132 formed thereon. When energy is passed through the mask 128, areas not having an opaque material 132 permit the energy to pass through and expose the photoresist 126, as shown. The photoresist 126 is then removed, leaving the structure shown in FIG. 6, having a pattern 134 for conductive lines and a pattern 136a and 136b for at least one scattering bar on each side of the pattern 134 for the conductive lines. Alternatively, the second insulating material 124 may be directly patterned, as described for the first insulating material 122.

Figure 7:
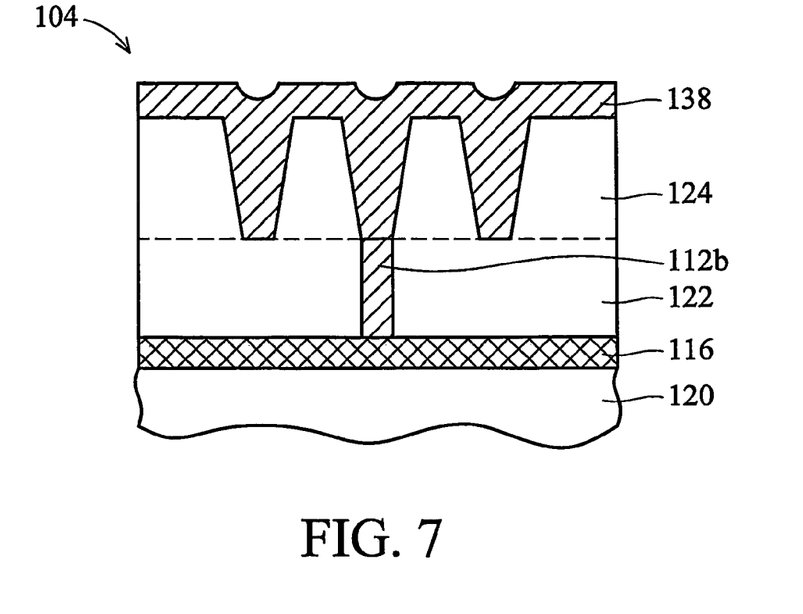

A conductive material 138 is deposited over the top surface of the patterned second insulating material 124, as shown in FIG. 7. The conductive material 138 fills the patterns 134 for the conductive lines, and also fills the patterns 136a and 136b for the scattering bars, as shown.

Figure 8:
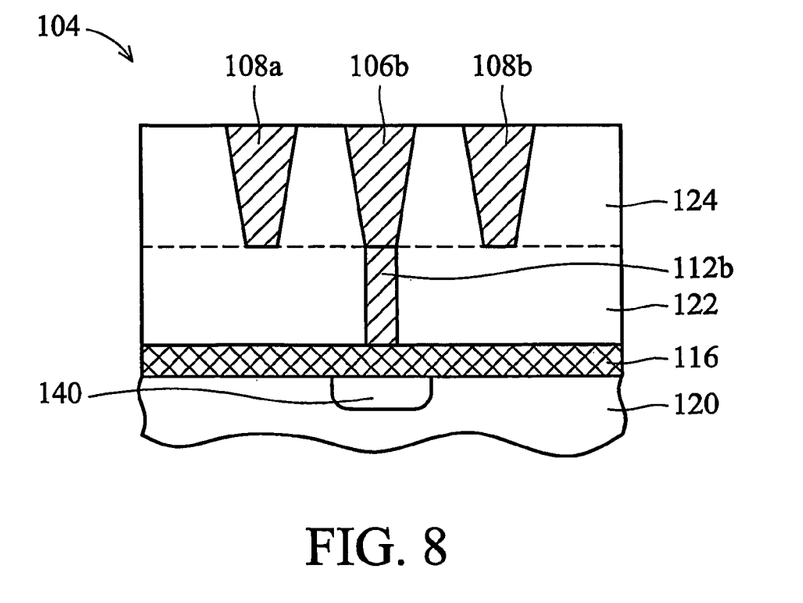

Excess conductive material 138 is removed from the top surface of the second insulating material 124, using CMP or an etch process, as examples, leaving the structure shown in FIG. 8. The structure comprises a conductive line 106b formed over each via 112b, and a scattering bar 108a on one side of the conductive line 106b, in addition to a scattering bar 108b on the opposite side of the conductive line 106b. The optional conductive line 116 may be present in this structure, or it may not be included. The via 112b may make electrical contact to the optional conductive line 116 in an underlying metallization layer, or alternatively, the via 112b may make electrical contact to an active area 140 of the workpiece 120 or other conductive line or component elsewhere in the semiconductor device 100, as examples.

Conductive lines 106a and vias 112a are preferably simultaneously formed in a dense region 102 of the workpiece 100, (see FIG. 3) as described for the isolated region 104 shown in FIGS. 4 through 8. Embodiments of the present invention are easily adapted into existing manufacturing process flows, and additional lithography masks are not required.

The conductive lines 106 and 116, scattering bars 108, and vias 112 described herein preferably comprise copper, aluminum, tungsten, other conductive material, or combinations thereof, as examples. One or more barrier layers and seed layers may be deposited prior to the deposition of the copper, aluminum, tungsten, other conductors, or combinations thereof, for example (not shown).

The insulating layers 118, 112 and 124 described herein preferably comprise traditional insulating materials used for interconnect layers such as $SiO_2$, or alternatively may comprise low-k materials. The low k material may comprise diamond-like carbon, such as Black Diamond™ by Applied Materials, Inc., phosphosilicate glass (PSG), borophosphosilicate glass (BPSG), fluorinated silicate glass or fluorinated silicon oxide glass (FSG), $SiO_xC_y$, Spin-On-Glass, Spin-On-Polymers, SILK™ by Dow Chemical, FLARE™ by Honeywell, LKD (low k dielectric) from JSR Micro, Inc., hydrogenated oxidized silicon carbon material (SiCOH), amorphous hydrogenated silicon (a-Si:H), $SiO_xN_y$, SiC, SiCO, SiCH, compounds thereof, composites thereof, and/or combinations thereof, as examples. In other applications, the insulating layers 118, 112 and 124 may comprise a high dielectric constant material, having a dielectric constant of greater than about 4.0, for example. The insulating layers 118, 112 and 124 may alternatively comprise a combination of one or more low k materials, high k material, or silicon dioxide, for example.

FIGS. 9 through 12 show cross-sectional views of an embodiment of the present invention implemented in a dual damascene manufacturing process, wherein a via pattern is formed before a pattern for a conductive line and a pattern for scattering bars are formed in isolated regions 204 of a semiconductor device. Similar reference numbers are designated for the various elements as were used in FIGS. 4 through 8. To avoid repetition, each reference number shown in the diagram is not described in detail herein. Rather, similar materials x02, x04, x06, etc. . . . are preferably used for the material layers shown as were described for FIGS. 4 through 8, where x=1 in FIGS. 4 through 8, and x=2 in FIGS. 9 through 12. As an example, the preferred and alternative materials listed for the conductive material for the conductive lines 106 and vias 112 in the description for FIGS. 4 through 8 are preferably also used for the conductive material for the conductive lines 206, scattering bars 208, and vias 212 in FIGS. 9 through 12.

Figure 9:
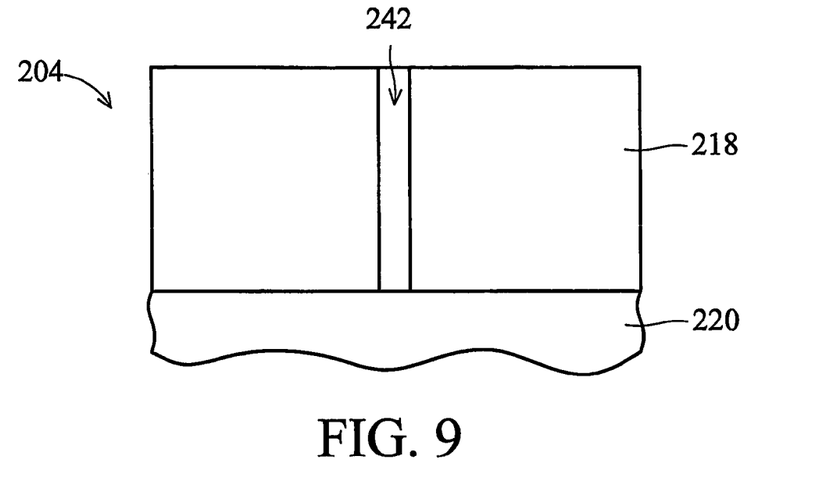
FIGS. 9 through 12 show cross-sectional views of an embodiment of the present invention implemented in a dual damascene manufacturing process, wherein a via pattern is formed before a pattern for a conductive line and scattering bars in isolated regions of a semiconductor device.

In this embodiment, an insulating material layer 218 is formed or deposited over a workpiece 220, as shown in FIG. 9. The insulating material layer 218 is preferably thicker than the first insulating material 122 and second insulating material 124 shown in FIGS. 4 through 8, for example. The insulating material layer 218 must be of a sufficient thickness to accommodate both vias, and conductive lines and scattering bars, of the semiconductor device. Again, only the isolated region 204 of a semiconductor device will be shown in FIGS. 9 through 12, although vias and conductive lines may be simultaneously formed in a dense region of the semiconductor device, as shown in FIG. 3. The insulating material layer 218 preferably comprises similar materials as was described for insulating material layers insulating layers 118, 112 and 124 above, for example.

Referring again to FIG. 9, in a via first dual damascene process, first, the insulating material 218 is patterned with a pattern 242 for a via. The insulating material layer 218 is preferably patterned through its entire thickness, as shown.

Figure 10:
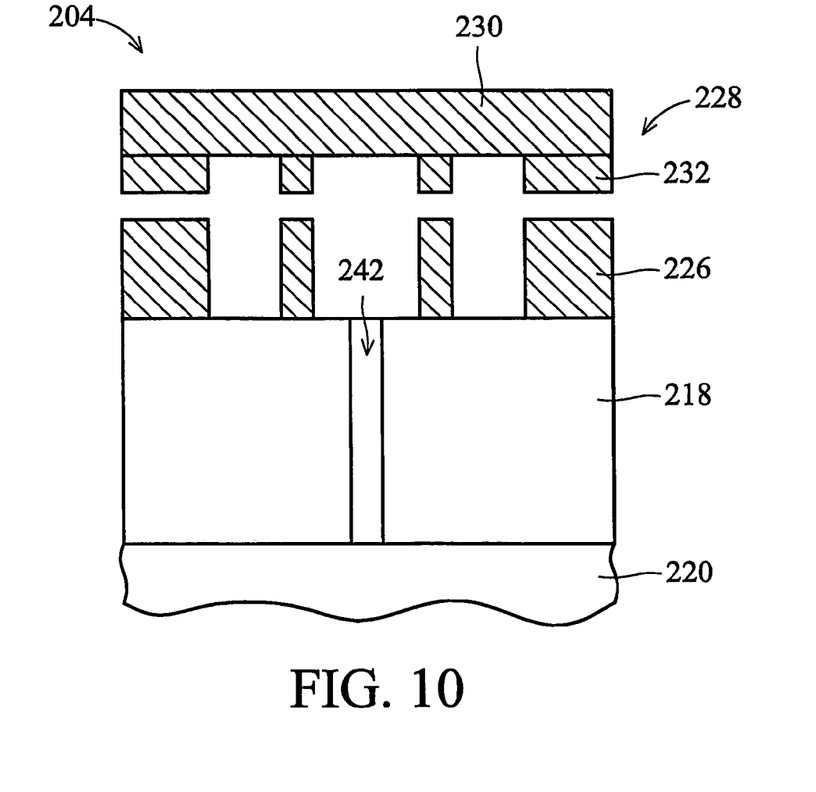
Figure 11:
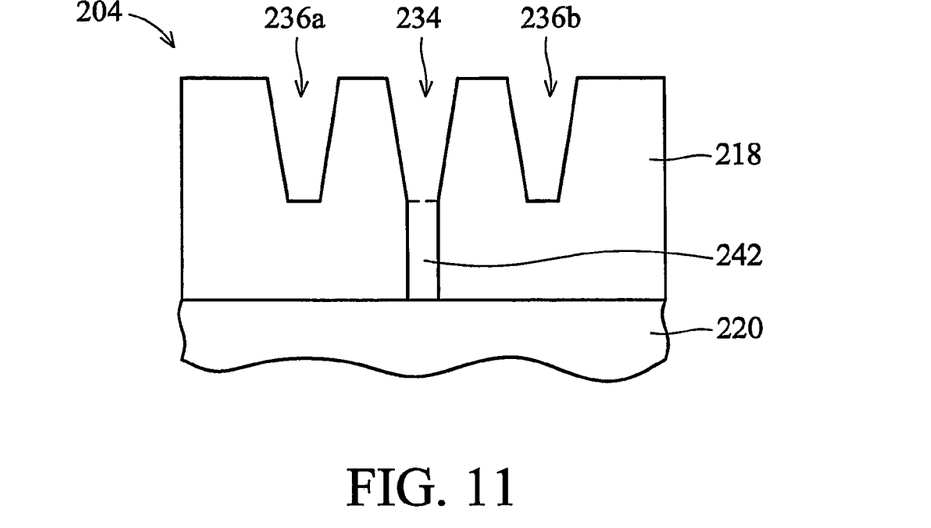

Next, the insulating material layer 218 is patterned with the pattern 234 for conductive lines and patterns 236a and 236b for scattering bars, as shown in FIGS. 10 and 11. The insulating material layer 218 may be patterned, for example, by depositing a photoresist 226 over the top surface of the insulating material layer 218, as shown in FIG. 10, and using a mask 228 having transparent regions 230 and opaque regions 232 having a pattern formed therein to pattern the photoresist 226.

The photoresist 226 is then used as a mask to pattern a top portion of the insulating material layer 218, as shown in FIG. 11. The pattern in the top portion of the insulating material layer 218 includes a pattern 234 for a conductive line disposed over the via pattern 242, and also includes a scattering bar pattern 236a and 236b disposed on each side of the conductive line pattern 234 adjacent but spaced away from the conductive line pattern 234, as shown.

Alternatively, the insulating material layer may be directly patterned for the via pattern 242 and the conductive line pattern 234 and scattering bar patterns 236a and 236b, using EBL, as an example.

Figure 12:
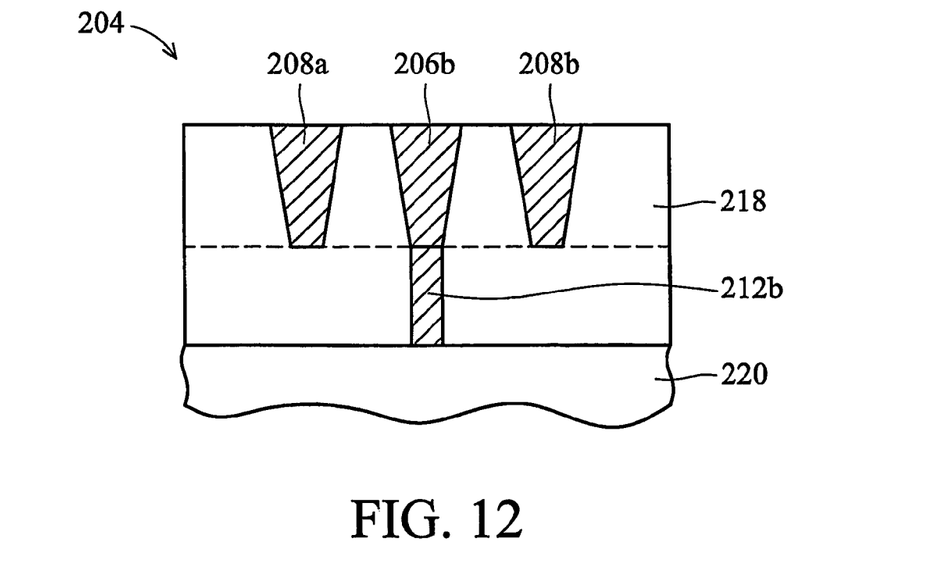

A conductive material is deposited over the top surface of the patterned insulating material layer 218, and excess portions of the conductive material are removed to form an isolated conductive line 206b, a scattering bar 208a adjacent one side of the conductive line 206b, and a scattering bar 208b adjacent the other side of the conductive line 206b, as shown in FIG. 12.

A similar process flow as described for FIGS. 9 through 12 may also be used to form a trench first dual damascene structure. In this embodiment, the mask 228 shown in FIG. 10 is first used to pattern a photoresist 226, which photoresist 226 is then used to pattern a top portion of the insulating material layer 218 and form the pattern 234 for the isolated conductive line and the patterns 236a and 236b for the scattering bars adjacent either side of the conductive line pattern 234. Next, a different lithography mask is used to pattern the insulating material layer 218 with the pattern 242 for the via in the insulating material layer 218. Alternatively, rather than using lithography masks to pattern the insulating material layer 218, a photoresist may be deposited over the insulating material layer 218, and the photoresist may be directly patterned using EBL or other direct patterning method. The pattern in the photoresist is then transferred to the insulating material layer 218 by etching the insulating material layer 218 using the photoresist as a mask, for example. Again, a conductive material is deposited over the patterned insulating material layer 218, leaving the structure shown in FIG. 12, wherein a scattering bar 208a and 208b is disposed on each side of the isolated conductive line 206b.

FIGS. 13 through 17 show cross-sectional views of another preferred embodiment of the present invention implemented in a dual damascene manufacturing process, wherein a photosensitive material is used for the insulating material. Again, similar reference numbers are designated for the various elements as were used in FIGS. 4 through 8 and 9 through 12. To avoid repetition, each reference number shown in the diagram is not described in detail herein. Rather, similar materials x02, x04, x06, etc. . . . are preferably used for the material layers shown as were described for FIGS. 4 through 8, and 9 through 12 where x=1 in FIGS. 4 through 8, x=2 in FIGS. 9 through 12, and x=3 in FIGS. 13 through 17.

Figure 13:
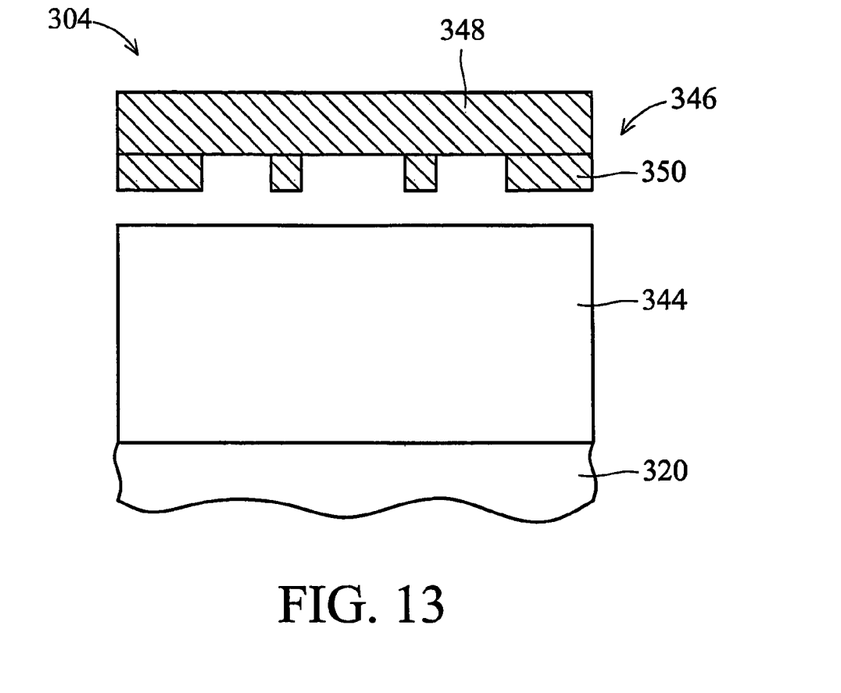
FIGS. 13 through 17 show cross-sectional views of an embodiment of the present invention implemented in a dual damascene manufacturing process, wherein a photosensitive material is used for the insulating material, and a pattern for a conductive line and scattering bars are formed before a via pattern is formed.

In this embodiment, the insulating material 344 deposited over the workpiece 320 comprises a photosensitive insulating or dielectric material. Thus, the use of a photoresist is not required to pattern the photosensitive insulating or dielectric material 344. Rather, in this embodiment, the photosensitive insulating material 344 is directly patterned using a lithography mask 346 having transparent areas 348 and opaque areas 350, as shown in FIG. 13. The photosensitive dielectric material 344 in one embodiment preferably comprises silicon, and may alternatively comprise an organic material, as examples, although alternatively, the photosensitive dielectric material 344 may comprise other materials that may be directly patterned.

Figure 14:
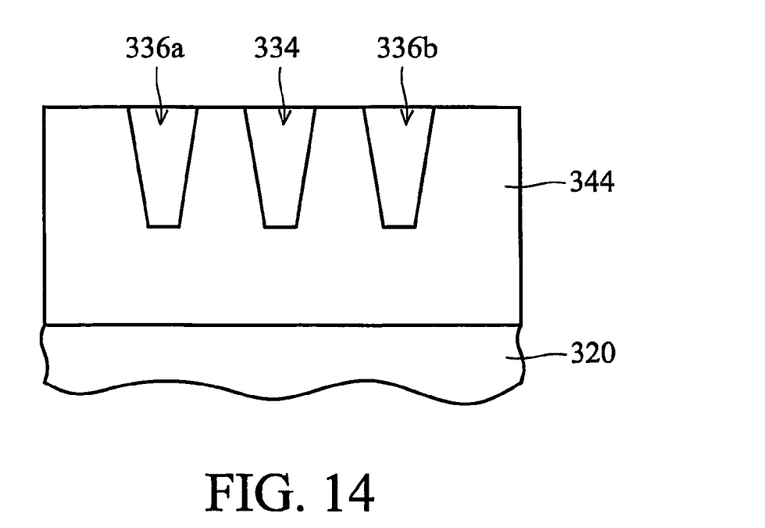
Figure 15:
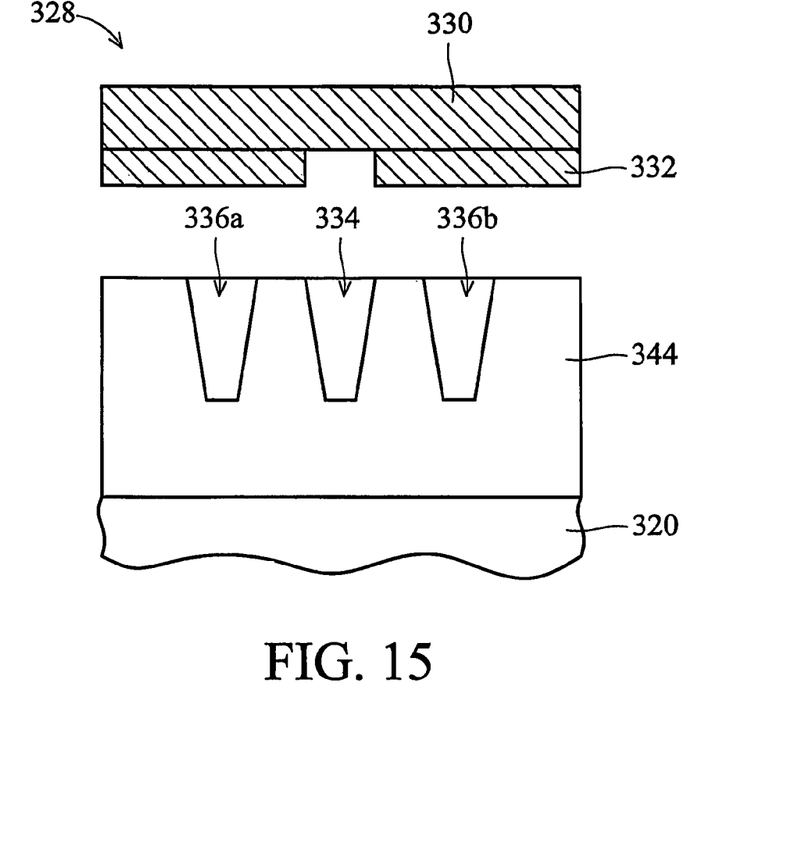
Figure 16:
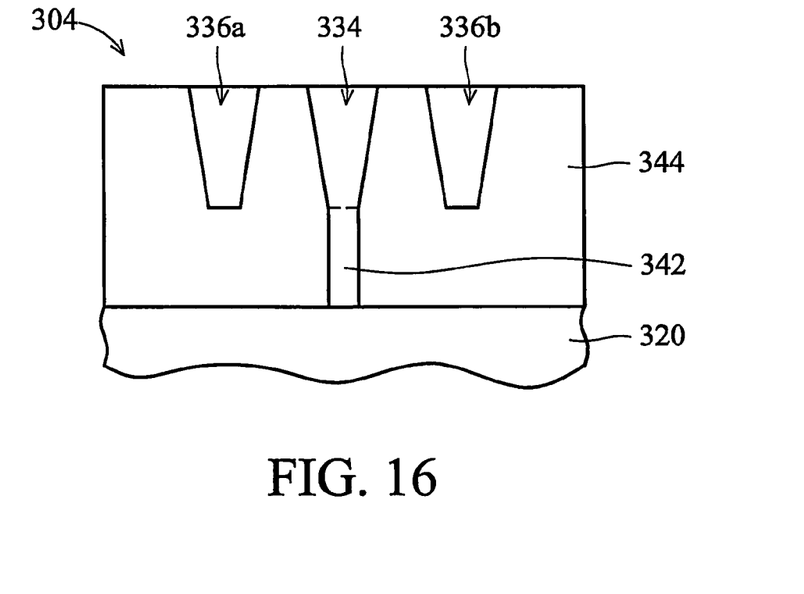

A trench first dual damascene process will be shown in the following FIGS. 14 through 17. First, the photosensitive insulating material 344 is patterned with a pattern for an isolated conductive line 334 and the patterns 336a and 336b for a scattering bar adjacent each side of the isolated conductive line pattern 334, as shown in FIG. 14. Next, a mask 328 having the via pattern formed in a opaque area 332 of the mask 328 is used to directly pattern the photosensitive insulating material 344 in the region beneath the pattern 334 for the isolated conductive line, as shown in FIG. 16. Again, the via pattern 342 is preferably formed beneath the pattern 334 for the isolating conductive line. The via 342 pattern preferably extends through the remaining portion of the photosensitive insulating material 344 so that electrical contact may be made to the workpiece 320, as shown in FIG. 16. Rather than using a lithography mask, the photosensitive insulating material 344 may alternatively be directly patterned.

Figure 17:
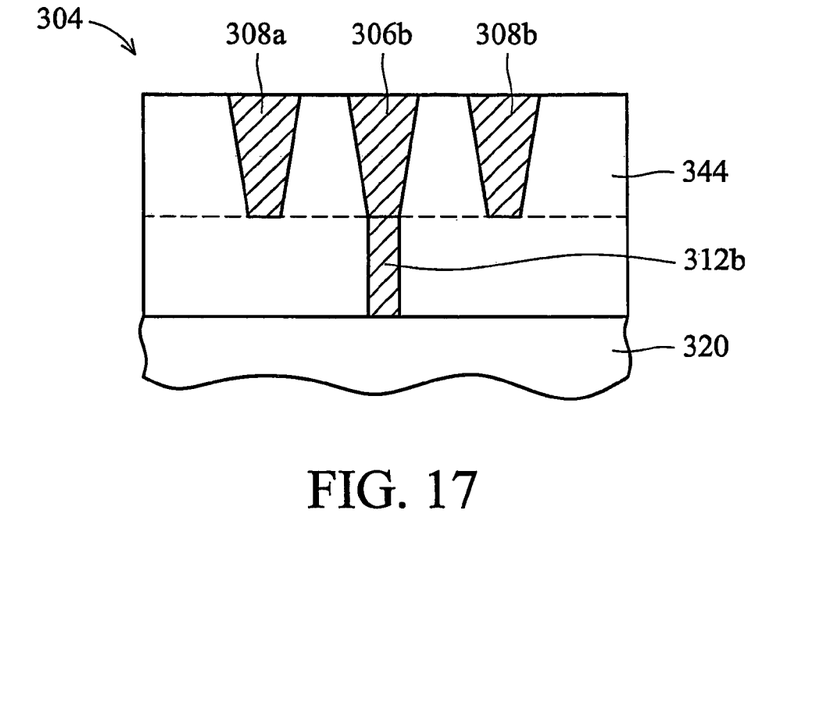

A conductive material is then deposited over the patterned photosensitive insulating material 344 to fill the patterns 334, 342, 336a and 336b, forming via 312b that is electrically coupled to isolated conductive line 306b, and scattering bars 308a and 308b that are not electrically active, as shown in FIG. 17. Again, preferably, closely spaced conductive lines and vias are simultaneously formed in dense regions of the semiconductor device, not shown (see FIG. 3).

Figure 18:
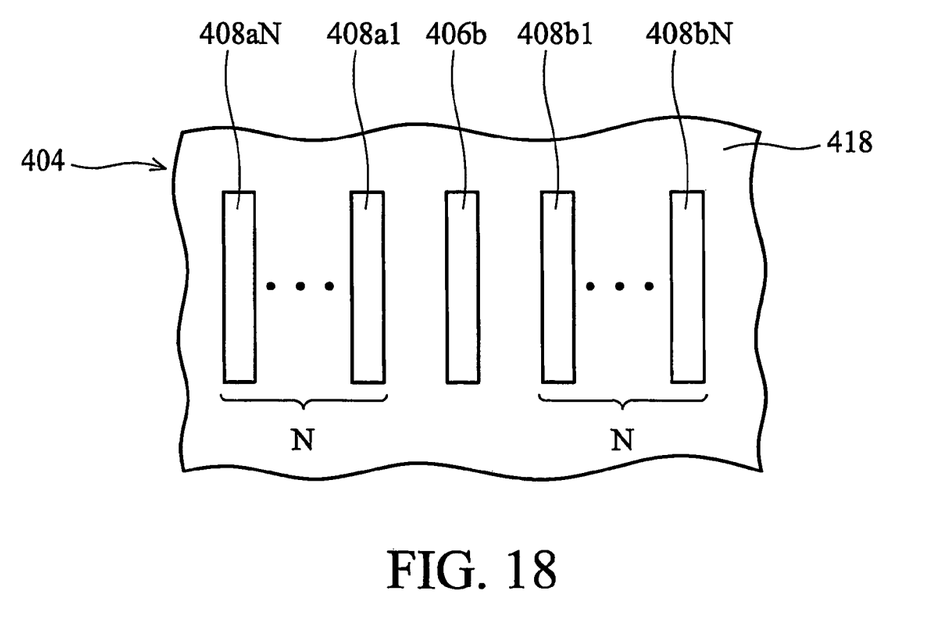
FIG. 18 shows a top view of a preferred embodiment of the present invention, where N number of scattering bars are disposed on each side of a conductive line in an isolated region of a semiconductor device.

FIG. 18 shows a top view of a preferred embodiment of the present invention, where N number of scattering bars 408a1 through 408aN and 408b1 through 408bN are disposed on each side of a conductive line 406b in an isolated region 404 of a semiconductor device. In this embodiment, a plurality of scattering bars 408a1 through 408aN and 408b1 through 408bN are formed on each side of the isolated conductive lines 406b in the isolated regions 404 of a semiconductor device. In one embodiment, the number N is preferably 4 or less. For example, there may be one, two, three, or four scattering bars 408a1 through 408aN and 408b1 through 408bN disposed on each side of the conductive line 106b. Preferably, the same number N of scattering bars 408a1 through 408aN and 408b1 through 408bN are disposed on each side of the conductive line 406b. Each scattering bar 408a1 through 408aN and 408b1 through 408bN is preferably spaced apart from an adjacent scattering bar 408a1 through 408aN and 408b1 through 408bN and from the conductive line 406b by a distance of about 0.5 μm or less, for example.

Figure 19:
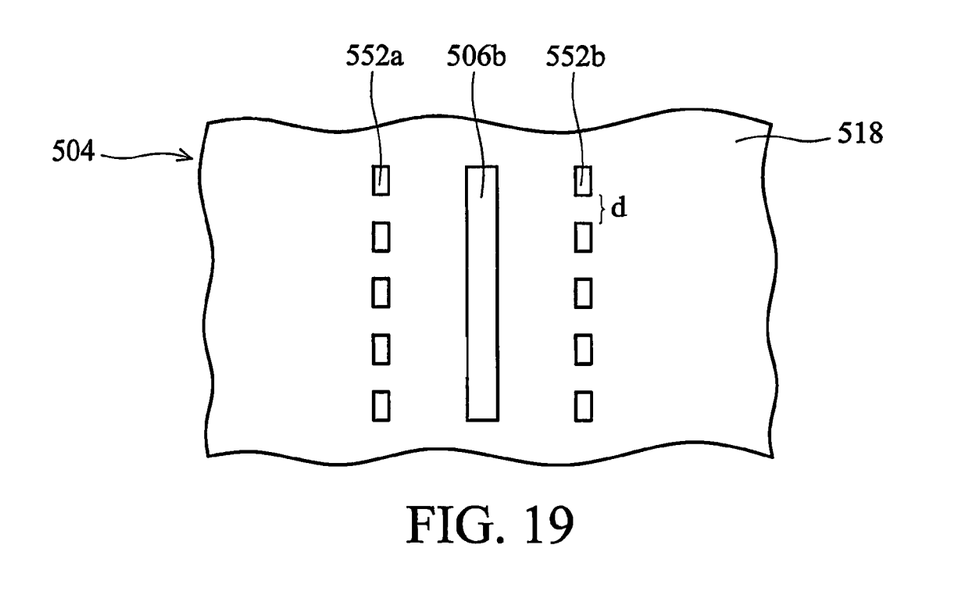
FIG. 19 shows a top view of another embodiment of the present invention, wherein the scattering bars comprise non-continuous lines of conductive material.

FIG. 19 shows a top view of another preferred embodiment of the present invention, wherein the scattering bars 552a and 552b preferably comprise non-continuous formations of conductive material, as shown. The space "d" of the discontinuity in the scattering bars 552a and 552b is preferably about 0.1 μm or less, for example. In this embodiment, the scattering bar patterns comprise a plurality of trenches separated by a plurality of discontinuity regions d. Thus, the scattering bars 552a and 552b in this embodiment each comprise a plurality of regions of conductive material separated by a plurality of regions of the insulating material 518, as shown.

Figure 20:
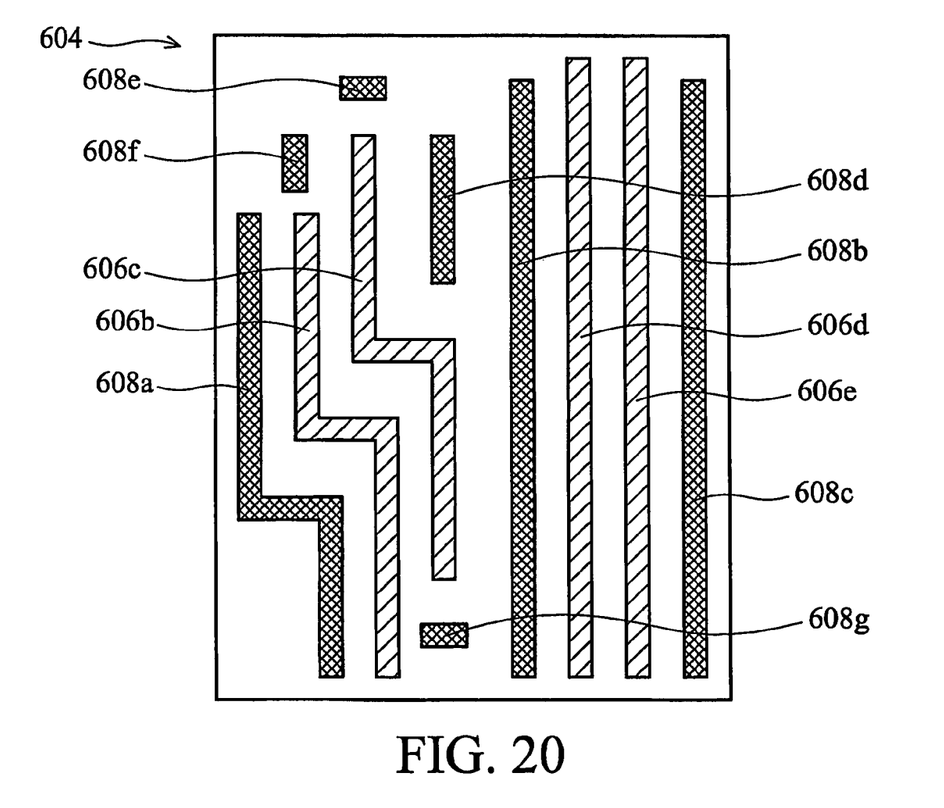
FIG. 20 shows a top view of an embodiment of the present invention, wherein the conductive lines in the isolated region do not comprise straight lines, and additional portions of scattering bars are added proximate the end of the conductive lines.

FIG. 20 shows a top view of an embodiment of the present invention, wherein the conductive lines 606b and 606c in the isolated region 604 do not comprise straight conductive lines, and additional smaller scattering bars 608e, 608f, 608g are added proximate the ends of the conductive lines 606c, 606b, and 608g, respectively. In this embodiment, the isolated region 604 comprises conductive lines 606d and 606e that are substantially straight and elongated. However, conductive lines 606b and 606c are not straight and may comprise an L shape, S-shape, or may traverse a length and may have several bends in them, as shown. The scattering bars 608a through 608g are preferably disposed proximate the sides and ends of the conductive lines 606b through 606e, as shown. For example, scattering bar 608a is disposed proximate one side of the conductive line 606b. The scattering bar 608a comprises similar bends along its length to the bends of conductive lines 606b. Scattering bars 608b and 608c are substantially elongated and straight, similar to the shape of conductive lines 606d and 606e. Scattering bar 608d runs along a portion of conductive line 606c, as shown. In this instance, scattering bar 608b runs along the lower length of the conductive line 606c. Scattering bars 608e, 608f, and 608g comprise shorter patterns that are placed proximate the ends of conductive lines 606b and 606c.

Note also in this embodiment that conductive lines 606b and 606c, and 606d and 606e, are in close proximity. Therefore, in this embodiment, scattering bars are not required and are not included between these sets of conductive lines.

By proper design placement of the scattering bars 608a through 608g as shown in FIG. 20, the optimum lithography improvement may be obtained in accordance with embodiments of the present invention. Again, preferably, the scattering bars 608a through 608g are left remaining in the final product and thus, there are no additional process steps required to remove them.

Figure 21:
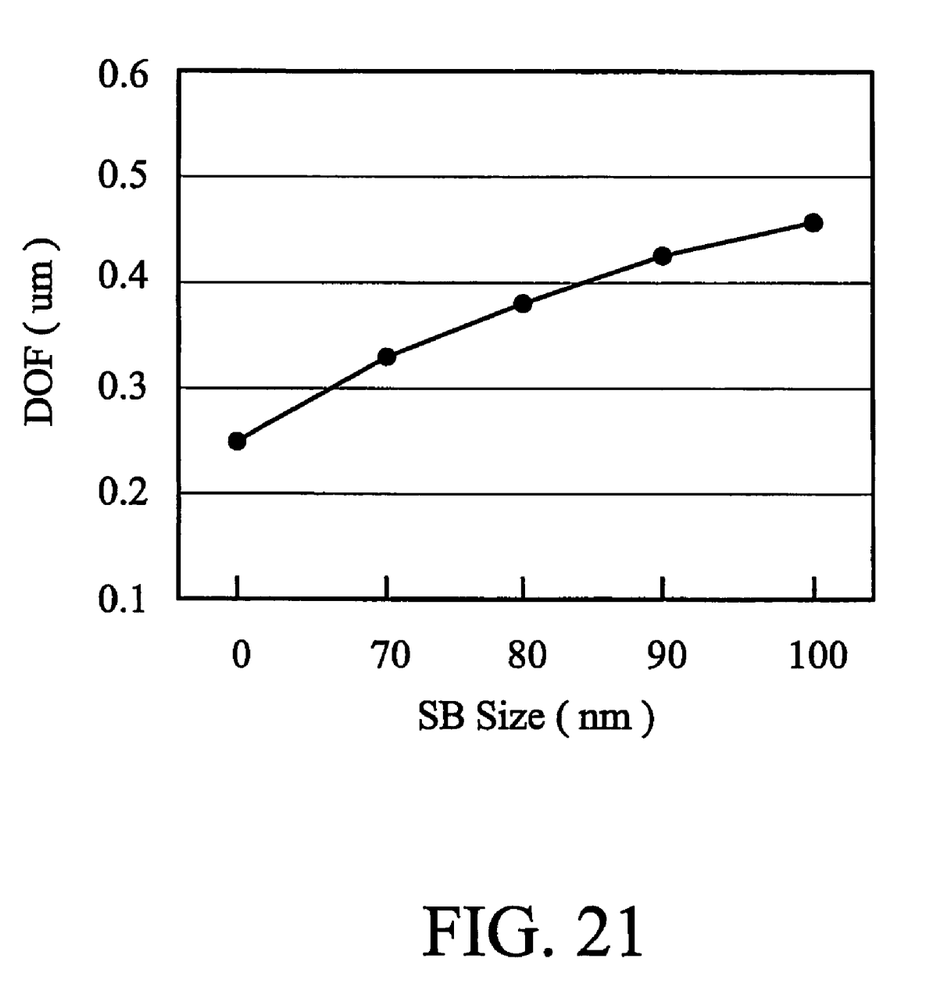
FIG. 21 is a graph showing experimental results of various size scattering bars, showing the effect on the depth of focus (DOF) of adjacent conductive lines.

FIG. 21 is a graph showing experimental results of various size scattering bars, showing the effect on the depth of focus (DOF). The graph depicts the DOF in μm for a plurality of sizes of scattering bars, depicted in nm. The experimental results showed that the depth of focus is improved by an enlarged bias of scatter size, with the increased size of the scattering bar thickness.

Advantages of embodiments of the present invention include providing a method and structure wherein the lithography techniques, depth of focus, and optical proximity correction are optimized for conductive lines in isolated regions of a semiconductor device. Other advantages include improved etch loading effect for isolated to dense features, and improved local CMP loading effect.

While embodiments of the present invention have been described herein and are particularly advantageous when used in damascene patterning processes, the scattering bars described herein may also be formed in metallization layers using a subtractive process: e.g., a conductive material may be deposited over a workpiece, the conductive material may be patterned with a pattern for a conductive line and at least one scattering bar on both sides of the conductive line, and the spaces between the conductive line and the scattering bars may be filled with an insulating material. The presence of the scattering bar formed in the metallization layer improves and controls the CD of the conductive line. A good process window for DOF and proximity also results.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a workpiece;
   an insulating material disposed over the workpiece;
   a first conductive line disposed within a first trench defined in the insulating material, the first conductive line comprising a first side and a second side the first and second sides having a first length in a plan view; and
   an N number of first scattering bars disposed within an N number of trenches defined in the insulating material adjacent and spaced apart in a lateral direction from the first side of the first conductive line, the first scattering bars comprising a second length in a plan view, wherein the second length is about equal to the first length, wherein the first conductive line is electrically active, and wherein the N number of first scattering bars are electrically inactive.

2. The semiconductor device according to claim 1 further comprising an N number of second scattering bars disposed within the N number of trenches defined in the insulating material adjacent and spaced apart from the second side of the first conductive line, the second scattering bars comprising a third length, wherein the third length is about equal to the first length, wherein the N number of second scattering bars are electrically inactive.

3. The semiconductor device according to claim 2, wherein N=1, 2, 3, or 4.

4. The semiconductor device according to claim 2, wherein the first scattering bars and the second scattering bars comprise a first width, wherein the first conductive line comprises a second width, wherein the first width is about ½ to equal the second width.

5. The semiconductor device according to claim 2, wherein the first scattering bars and the second scattering bars are spaced apart from the first conductive line by about 0.5 µm or less.

6. The semiconductor device according to claim 2, further comprising:
    at least one third scattering bar formed within the trench defined in the insulating material adjacent and spaced apart from an end of the first conductive line.

7. The semiconductor device according to claim 2, wherein the N number of first scattering bars or second scattering bars comprises at least one non-continuous scattering bar, the at least one non-continuous scattering bar comprising a plurality of regions of conductive material separated by a plurality of regions of the insulating material.

8. The semiconductor device according to claim 7, wherein the at least one non-continuous scattering bar pattern comprises a plurality of discontinuity regions, wherein the discontinuity regions comprise a width of about 0.1 µm or less.

9. The semiconductor device according to claim 1, wherein the first conductive line comprises a width of about 130 nm or less.

10. The semiconductor device according to claim 1, wherein the insulating material comprises a photosensitive dielectric material.

11. The semiconductor device according to claim 10, wherein the photosensitive dielectric material comprises silicon or an organic material.

* * * * *

UNITED STATES PATENT AND TRADEMARK OFFICE
CERTIFICATE OF CORRECTION

| | | |
|---|---|---|
| PATENT NO. | : 7,339,272 B2 | |
| APPLICATION NO. | : 10/867076 | |
| DATED | : March 4, 2008 | |
| INVENTOR(S) | : Chen et al. | |

It is certified that error appears in the above-identified patent and that said Letters Patent is hereby corrected as shown below:

On the Title Page, item (56) References Cited, U.S. PATENT DOCUMENTS, Page 1, column 2, 8$^{th}$ entry, delete "Nalk" and insert --Naik--.
On the Title Page, item (56) References Cited, OTHER PUBLICATIONS, delete "Laltice" and insert --Lattice--.

Signed and Sealed this

Third Day of June, 2008

JON W. DUDAS
*Director of the United States Patent and Trademark Office*